United States Patent
Maeda

(10) Patent No.: US 7,649,393 B2
(45) Date of Patent: Jan. 19, 2010

(54) SEMICONDUCTOR INTEGRATED CIRCUIT HAVING ACTIVE AND SLEEP MODES AND NON-RETENTION FLIP-FLOP THAT IS INITIALIZED WHEN SWITCHING FROM SLEEP MODE TO ACTIVE MODE

(75) Inventor: Tasuku Maeda, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 12/213,437

(22) Filed: Jun. 19, 2008

(65) Prior Publication Data
US 2008/0315931 A1 Dec. 25, 2008

(30) Foreign Application Priority Data
Jun. 20, 2007 (JP) ............................. 2007-163069

(51) Int. Cl.
H03K 3/02 (2006.01)
(52) U.S. Cl. .................... 327/198; 327/202; 327/208
(58) Field of Classification Search ......... 327/198–204, 327/208, 214, 224
See application file for complete search history.

(56) References Cited

U.S. PATENT DOCUMENTS

| | | | |
|---|---|---|---|
| 6,310,491 B1 | 10/2001 | Ogawa | |
| 6,404,254 B2 | 6/2002 | Iwaki et al. | |
| 6,433,584 B1 | 8/2002 | Hatae | |
| 6,437,623 B1 | 8/2002 | Hsu et al. | |
| 6,870,412 B2 | 3/2005 | Cho | |
| 6,965,261 B2 | 11/2005 | Tran et al. | |
| 6,989,702 B2 | 1/2006 | Ko et al. | |
| 7,154,317 B2 | 12/2006 | Flynn et al. | |
| 7,164,301 B2 | 1/2007 | Chun | |
| 7,170,327 B2 | 1/2007 | Aksamit | |
| 7,180,348 B2* | 2/2007 | Frederick et al. | 327/199 |
| 7,183,825 B2 | 2/2007 | Padhye et al. | |
| 7,221,205 B2* | 5/2007 | Kinkade et al. | 327/203 |
| 7,227,383 B2 | 6/2007 | Hoberman et al. | |
| 7,332,949 B2 | 2/2008 | Kim | |
| 7,348,804 B2* | 3/2008 | Hoberman et al. | 326/82 |

FOREIGN PATENT DOCUMENTS

| | | |
|---|---|---|
| JP | A-03-236620 | 10/1991 |
| JP | A-03-255714 | 11/1991 |
| JP | A-11-205110 | 7/1999 |
| JP | A-2003-091337 | 3/2003 |

\* cited by examiner

*Primary Examiner*—Lincoln Donovan
*Assistant Examiner*—Hai L Nguyen
(74) *Attorney, Agent, or Firm*—Oliff & Berridge, PLC

(57) ABSTRACT

A semiconductor integrated circuit has an active mode and a sleep mode. The semiconductor integrated circuit is constructed by alternately connecting a plurality of combinational logic circuits and a plurality of flip-flops. The flip-flops include a retention flip-flop that is supplied with electric power and retains the data in the sleep mode, and a non-retention flip-flop that is not supplied with electric power during the sleep mode. The non-retention flip-flop includes an initializing circuit that initializes the non-retention flip-flop when the semiconductor integrated circuit is switched from the sleep mode to the active mode.

23 Claims, 6 Drawing Sheets

SEMICONDUCTOR INTEGRATED CIRCUIT HAVING ACTIVE AND SLEEP MODES AND NON-RETENTION FLIP-FLOP THAT IS INITIALIZED WHEN SWITCHING FROM SLEEP MODE TO ACTIVE MODE

CROSS-REFERENCE TO RELATED APPLICATION

This application claims priority from Japanese Application No. 2007-163069, filed Jun. 20, 2007, which is incorporated herein by reference in its entirety.

BACKGROUND

This invention relates to semiconductor integrated circuits constructed by alternately connecting combinational logic circuits and flip-flops.

In a semiconductor integrated circuit having a construction in which flip-flops are alternately connected with combinational logic circuits, data processed in a combinational logic circuit in the preceding stage is captured in a flip-flop synchronously with a clock signal, and the processed data is transferred to a combinational logic circuit in the succeeding stage.

Semiconductor integrated circuits may be designed using low power-consumption design techniques such as MTC-MOS (Multi-Threshold CMOS) technique. The low power-consumption design techniques employ combinational logic circuits and flip-flops that are able to be switched between an active mode and a sleep mode. Supply of electric power to unnecessary portions of the integrated circuit is terminated when in the sleep mode. For example, see U.S. Pat. No. 6,404,254, which is incorporated by reference in its entirety.

In the low power-consumption design, retention flip-flops may be used in addition to standard or non-retention flip-flops. During the sleep mode, supply of electric power to the non-retention flip-flops is terminated. Meanwhile, during sleep mode, the supply of electric power is maintained to a portion of the retention flip-flops necessary to retain the data. For example, see U.S. Pat. Nos. 6,437,623, 6,870,412, 6,965,261, 6,989,702, 7,154,317, 7,164,301, 7,170,327, 7,183,825, 7,227,383, and 7,332,949, which are incorporated by reference in their entireties.

In the circuitry including retention flip-flops and non-retention flip-flops, it is required to initialize the non-retention flip-flops without initializing the retention flip-flops when returning from the sleep mode to the active mode. That is, the non-retention flip-flops, which do not retain the data during the sleep mode, should be initialized so that they do not output irregular data when returned to the active mode. The retention flip-flops, which retain the data during the sleep mode, should not be initialized so that they output the data retained therein when returned to the active mode.

The non-retention flip-flops may be initialized by, for example, supplying initialization signal to the non-retention flip-flops through a signal line specially provided for supplying the initialization signal. However, providing the special line requires an additional task during the design of the semiconductor integrated circuit. Furthermore, it is necessary to provide a circuit that detects the switching from the sleep mode to the active mode and generates the initialization signal.

SUMMARY

An exemplary object of this invention is to provide semiconductor integrated circuits that employ initializing circuits in non-retention flip-flops, thereby obviating the necessity for a circuit to generate an initialization signal or for providing a special line for supplying the initialization signal.

Exemplary embodiments according to this disclosure provide semiconductor integrated circuits having an active mode and a sleep mode. The semiconductor integrated circuit includes a plurality of combinational logic circuits and a plurality of flip-flops that are connected alternately with each other. Electric power is supplied to the combinational logic circuits and the flip-flops during the active mode so that the flip-flops hold data output from the combinational logic circuits. The plurality of flip-flops includes a retention flip-flop, and further includes a non-retention flip-flop. Supply of the electric power to the retention flip-flop is maintained during the sleep mode so that the retention flip-flop retains the data during the sleep mode, while the electric power is supplied to the non-retention flip-flop through a switch included in the non-retention flip-flop. The switch has a control terminal that receives a control signal, the control signal changes from a first level to a second level so that the switch turns from an OFF state to an ON state when the semiconductor integrated circuit switches from the sleep mode to the active mode, and the initializing circuit detects the change of the level of the control signal from the first level to the second level and initializes the non-retention flip-flop.

Another exemplary embodiment according to this disclosure provides semiconductor integrated circuits having an active mode and a sleep mode. The semiconductor integrated circuit includes a plurality of combinational logic circuits and a plurality of flip-flops that are connected alternately with each other. Electric power is supplied to the combinational logic circuits and the flip-flops during the active mode so that the flip-flops hold data output from the combinational logic circuits. The plurality of flip-flops includes a retention flip-flop, and further includes a non-retention flip-flop. Supply of the electric power to the retention flip-flop is maintained during the sleep mode so that the retention flip-flop retains the data during the sleep mode, while supply of the electric power to the non-retention flip-flop is terminated during the sleep mode. The non-retention flip-flop includes an initializing circuit that initializes the non-retention flip-flop when the semiconductor integrated circuit switches from the sleep mode to the active mode.

Another exemplary embodiment according to this disclosure provides non-retention flip-flops for use in a semiconductor integrated circuit having an active mode and a sleep mode. The non-retention flip-flop includes an input terminal that receives an input data, latch circuitry that holds the input data, an output terminal that outputs the data held in the latch circuitry, and a switch through which electric power is supplied to the latch circuitry. The switch has a control terminal that receives a control signal, the control signal changes from a first level to a second level so that the switch turns from an OFF state to an ON state when the semiconductor integrated circuit switches from sleep mode to active mode. The non-retention flip-flop further includes an initializing circuit that detects the change in the level of the control signal from the first level to the second level and initializes the latch circuitry.

Another exemplary embodiment according to this disclosure provides a method of processing data in a semiconductor integrated circuit having an active mode and a sleep mode. The semiconductor integrated circuit includes a plurality of combinational logic circuits and a plurality of flip-flops that are connected alternately with each other. The flip-flops include a retention flip-flop and a non-retention flip-flop. The method includes supplying electric power to the combinational logic circuits and to the flip-flops during the active mode so that the flip-flops hold data output from the combinational logic circuits, maintaining the supply of electric power to the retention flip-flop during the sleep mode so that the retention flip-flop retains the data during the sleep mode and outputs the data retained therein when the semiconductor integrated circuit returns to the active mode, and terminating the supply of electric power to the non-retention flip-flop during the sleep mode and initializing the non-retention flip-flop when the semiconductor integrated circuit returns to the active mode so that the non-retaining flip-flop outputs initialized data when the semiconductor integrated circuit returns to the active mode. The initializing includes providing a switch through which the electric power is supplied to the non-retention flip-flop, the switch having a control terminal that receives a control signal. The control signal changes from a first level to a second level so that the switch turns from an OFF state to an ON state when the semiconductor integrated circuit switches from the sleep mode to the active mode. The initializing further includes providing an initializing circuit in the non-retention flip-flop. The initializing circuit detects the change in the level of the control signal from the first level to the second level and initializes the non-retention flip-flop.

Another exemplary embodiment according to this disclosure provides a method of initializing a non-retention flip-flop in a semiconductor integrated circuit having an active mode and a sleep mode. The non-retention flip-flop includes an input terminal that receives an input data, latch circuitry that holds the input data, and an output terminal that outputs the data held in the latch circuitry. The method includes providing a switch through which electric power is supplied to the latch circuitry. The switch has a control terminal that receives a control signal, the control signal changes from a first level to a second level so that the switch turns from an OFF state to an ON state when the semiconductor integrated circuit switches from the sleep mode to the active mode. The method further includes providing an initializing circuit in the non-retention flip-flop. The initializing circuit detects the change of the level of the control signal from the first level to the second level and initializes the latch circuitry.

DETAILED DESCRIPTION OF EMBODIMENTS

Exemplary embodiments of the disclosed semiconductor integrated circuits and methods are explained below with reference to attached drawings.

A. Construction of a Semiconductor Integrated Circuit

Figure 1:
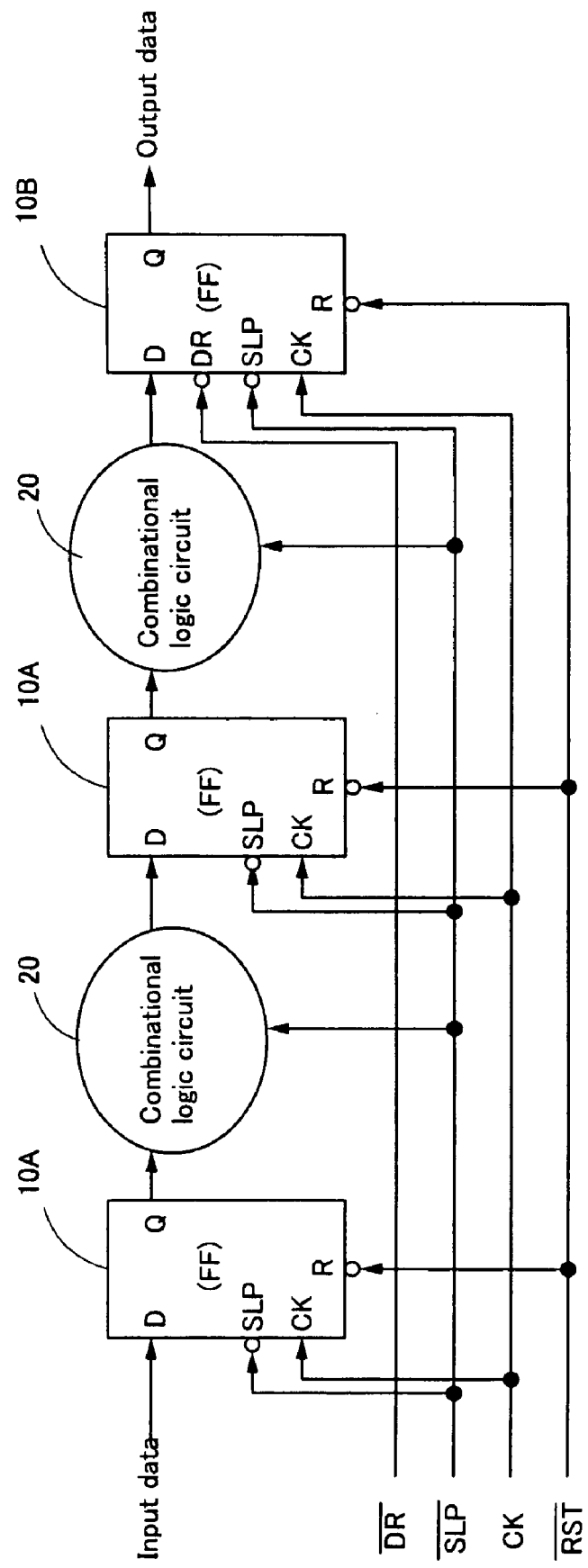
FIG. 1 is a block diagram of an exemplary semiconductor integrated circuit.

FIG. 1 is a block diagram showing a portion of an exemplary semiconductor integrated circuit constructed by alternately connecting combinational logic circuits and flip-flops. The exemplary semiconductor integrated circuit shown in FIG. 1 includes non-retention flip-flops 10A, retention flip-flops 10B and combinational logic circuits 20. The supply of electric power to of the combinational logic circuits 20 and the non-retention flip-flops 10A is terminated during the sleep mode by setting sleep signal SLP to an "L" level. In the retention flip-flop 10B, before setting the sleep signal SLP to "L" level, data retention signal DR is set to "L" level so that the data is retained. As a result, the supply of electric power during the sleep mode is maintained to a portion of the flip-flop 10B required to retain the data.

Note that, in FIG. 1, sleep signal SLP and data retention signal DR are shown as $\overline{SLP}$ and $\overline{DR}$, because these signals are active when they are "L" level.

In the active mode, an input data signal is input to the data terminal D of the flip-flop in the first stage, and a clock signal is supplied to clock terminals CK of the flip-flops. At the first edge of the clock signal, the input data is captured in the flip-flop in the first stage, and the captured data is held in the flip-flop and is supplied to the combinational logic circuit in the next stage. The combinational logic circuit processes the data supplied from the flip-flop and generates output data. Then, at the next edge of the clock signal, the data output from the combinational logic circuit is captured in the flip-flop in the next stage. The captured data is held in the flip-flop and is supplied to the combinational logic circuit in the next stage. By continuously supplying the clock signal, the data is successively supplied and processed in the plurality of combinational logic circuits alternately connected with a plurality of flip-flops.

In the sleep mode, the retention flip-flops retain the data held in the active mode, while the non-retention flip-flops do not retain the data. In semiconductor integrated circuits, thousands of flip-flops may be connected alternately with combinational logic circuits. A majority of the flip-flops may be non-retention flip-flops, and retention flip-flops may be used at certain selected stages where the data is required to be retained.

The exemplary semiconductor integrated circuit shown in FIG. 1 may also have a system reset terminal, which is connected to reset terminals R of the flip-flops. When starting to supply electric power to the semiconductor integrated circuit, for example, a system reset signal may be generated and supplied to the system reset terminal so that all of the flip-flops are initialized to their respective initial states.

B. Retention Flip-Flop

Figure 2:
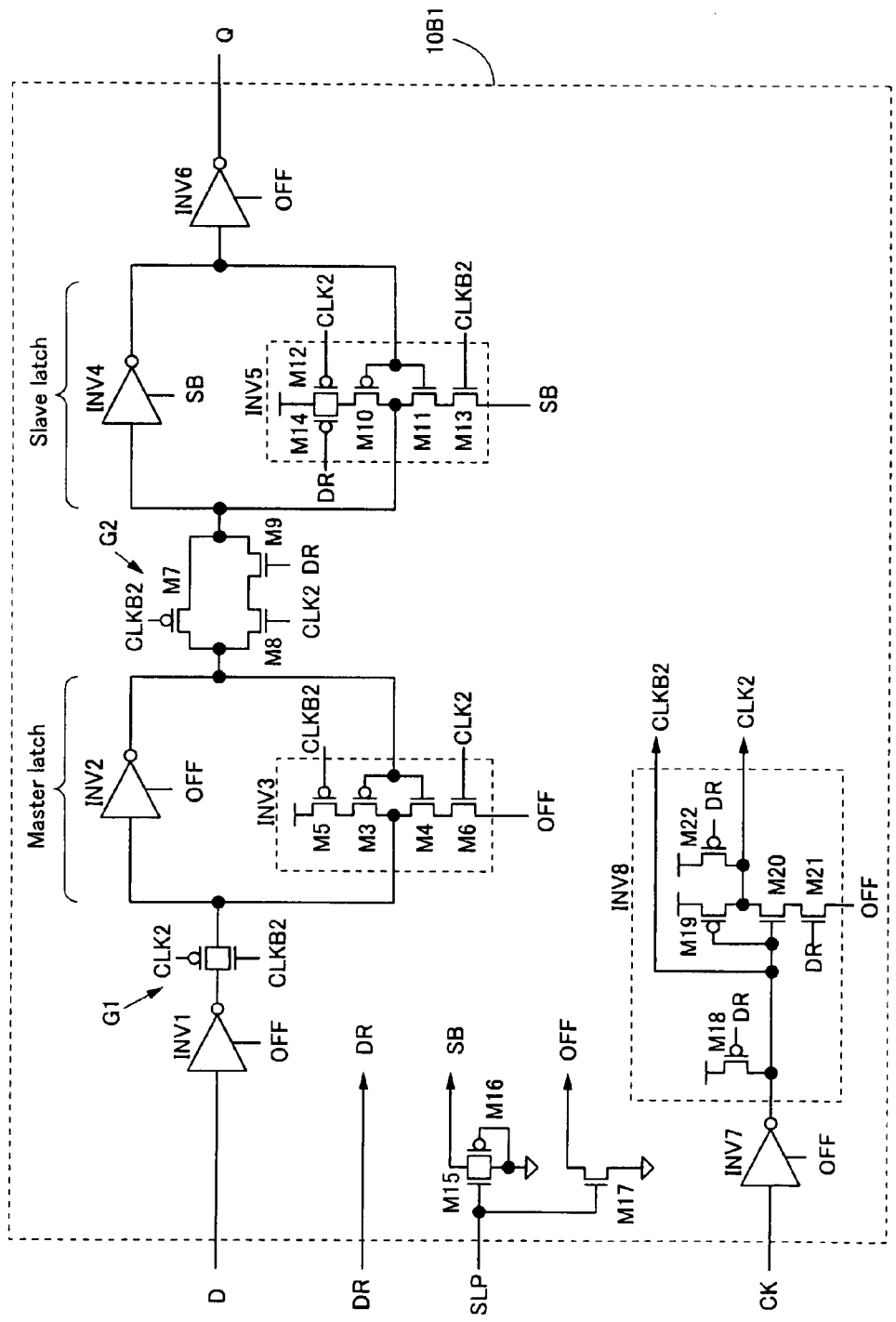
FIG. 2 is a circuit diagram of an exemplary retention flip-flop that constitutes a part of an exemplary semiconductor integrated circuit according to this disclosure.

FIG. 2 is a circuit diagram showing internal circuitry of an exemplary retention flip-flop 10B1 that constitutes a part of an exemplary semiconductor integrated circuit according to this disclosure. The exemplary retention flip-flop 10B1 suppresses power consumption in sleep mode by terminating the supply clock signals and further by terminating the supply of electric power to the flip-flop except to a portion of the flip-flop necessary to retain the data. See, for example, U.S. Pat. No. 7,227,383. In FIG. 2, INV1 to INV8 represent inverters, and G1 and G2 represent transmission gates. Each of inverters INV1, INV2, INV6, and INV7 may be constructed by, for example, connecting a PMOS transistor and an NMOS transistor in series between the VDD power supply and GND, and coupling the gates of the transistors together. Note however, that the source (OFF) of the NMOS transistor is not directly connected to the GND, but rather is connected to the GND through an NMOS transistor M17, which turns OFF when the sleep signal SLP is "L" level.

Transistor M17 acts as a switch controlled by sleep signal SLP. That is, when sleep signal SLP is at an "H" level (which represents the active mode), M17 turns ON and supplies electric power to each of inverters INV1, INV2, INV6, and INV7, thereby make the inverters active. While, when sleep signal SLP is "L" level (which represents the sleep mode), M17 turns OFF and cuts the supply of electric power to each of inverters INV1, INV2, INV3, INV6, and INV7.

Further, inverter INV4 has a construction that NMOS transistor M15 and PMOS transistor M16, which are connected in parallel with each other, are connected between source (SB) of NMOS transistor thereof and the GND. When sleep signal SLP is "L" level, NMOS transistor M15 turns OFF. On the other hand, PMOS transistor M16, which has a relatively high internal resistance, is always ON, because the gate of PMOS transistor M16 is connected to the GND.

Inverter INV3 is constructed with PMOS transistors M3 and M5 and NMOS transistors M4 and M6. Inverter INV3 is a clocked inverter supplied with negative clock signal CLKB2 and positive clock signal CLK2.

Inverter INV5 is constructed with PMOS transistors M10, M12, and M14, and NMOS transistors M11 and M13. Inverter INV5 is a clocked inverter supplied with positive clock signal CLK2 and negative clock signal CLKB2, and is also supplied with data retention signal DR.

Inverter INV8 is composed of PMOS transistors M18, M19, and M22, and NMOS transistors M20 and M21, and is supplied with data retention signal DR. Clock signal CK input to data-retention flip-flop 10A1 is transformed to positive clock signal CLK2 and negative clock signal CLKB2 by inverters INV7 and INV8, respectively.

Transmission gate G1 is supplied with positive clock signal CLK2 and negative clock signal CLKB2. Transmission gate G2 has a construction in which serially connected NMOS transistors M8 and M9 are connected in parallel with a PMOS transistor M7, and transmission gate G2 is supplied with positive clock signal CLK2, negative clock signal CLKB2, and data retention signal DR.

In the data-retention flip-flop 10B1, inverters INV2 and INV3 operate as a master latch, and inverters INV4 and INV5 operate as a slave latch.

In the active mode, sleep signal SLP is "H" level, and data retention signal DR is "H" level. When clock signal CK becomes "L" level, positive clock signal CLK2 becomes "L" level and negative clock signal CLKB2 becomes "H" level. As a result, transmission gate G1 turns ON, transmission gate G2 turns OFF, inverter INV3 turns OFF, and inverter INV5 turns ON. Accordingly, the input data input to D terminal is input to inverter INV2 through inverters INV1 and transmission gate G1.

Next, when clock signal CK becomes "H" level, opposite to the situation described above, transmission gate G1 turns OFF, transmission gate G2 turns ON, inverter INV3 turns ON, and inverter INV5 turns OFF. Accordingly, the input data is held in the master latch composed of inverters INV2 and INV3, transferred to inverter INV4 through transmission gate G2, and output to Q terminal through inverter INV6.

Then, when clock signal CK becomes "L" level again, transmission gate G2 turns OFF, and inverter INV5 turns ON. Accordingly, the input data is held in the slave latch composed of inverters INV4 and INV5, and is output to Q terminal through inverters INV4 and INV6.

As explained above, in the active mode, retention flip-flop 10B1 captures the data input into D terminal in the master latch when clock signal CK becomes "L" level. The captured data is held in the master latch and transferred to the slave latch, and is output to Q terminal when clock signal CK becomes "H" level. When clock signal CK becomes "L" level again, the data is held in the slave latch and is output to Q terminal.

Next, in order to switch to the sleep mode, at first, clock signal CK is fixed to "L" level. Thereby, positive clock signal CLK2 and negative clock signal CLKB2 are fixed to "L" and "H" levels, respectively. Accordingly, transmission gate G2 turns OFF and the slave latch is isolated from the master latch.

Then, data retention signal DR changes to "L" level. Accordingly, transistors M18 and M22 in inverter INV8 turns ON, causing both positive clock signal CKL2 and negative clock signal CLKB to be fixed to "H" level. As a result, transistor M8 turns ON. However, transmission gate G2 keeps the OFF state because transistor M9 turns OFF. In inverter INV5 of the slave latch, although transistor M12 turns OFF, transistor M14 turns ON. Accordingly, the slave latch keeps holding the data.

Thereafter, when sleep signal SLP changes to "L" level, transistor M17 turns OFF. As a result, supply of electric power to inverters INV1, INV2, INV3, INV6, INV7, and INV8 are terminated. Now, switching of the data-retention flip-flop into the power-saving mode (sleep mode) is completed. During this period, a minimum supply of electric power to inverters INV4 and INV5 through the transistor M16 is maintained, allowing inverters INV4 and INV5 to hold the data.

In order to switch the retention flip-flop 10B1 from the sleep mode to the active mode, on the other hand, sleep signal SLP changes from "L" level to "H" level and, then, data retention signal DR changes from "L" level to "H" level. Thereafter, the supply of clock signal CK is resumed. See, for example, FIG. 9 of U.S. Pat. No. 7,227,383.

C. Non-Retention Flip-Flip

Figure 3:
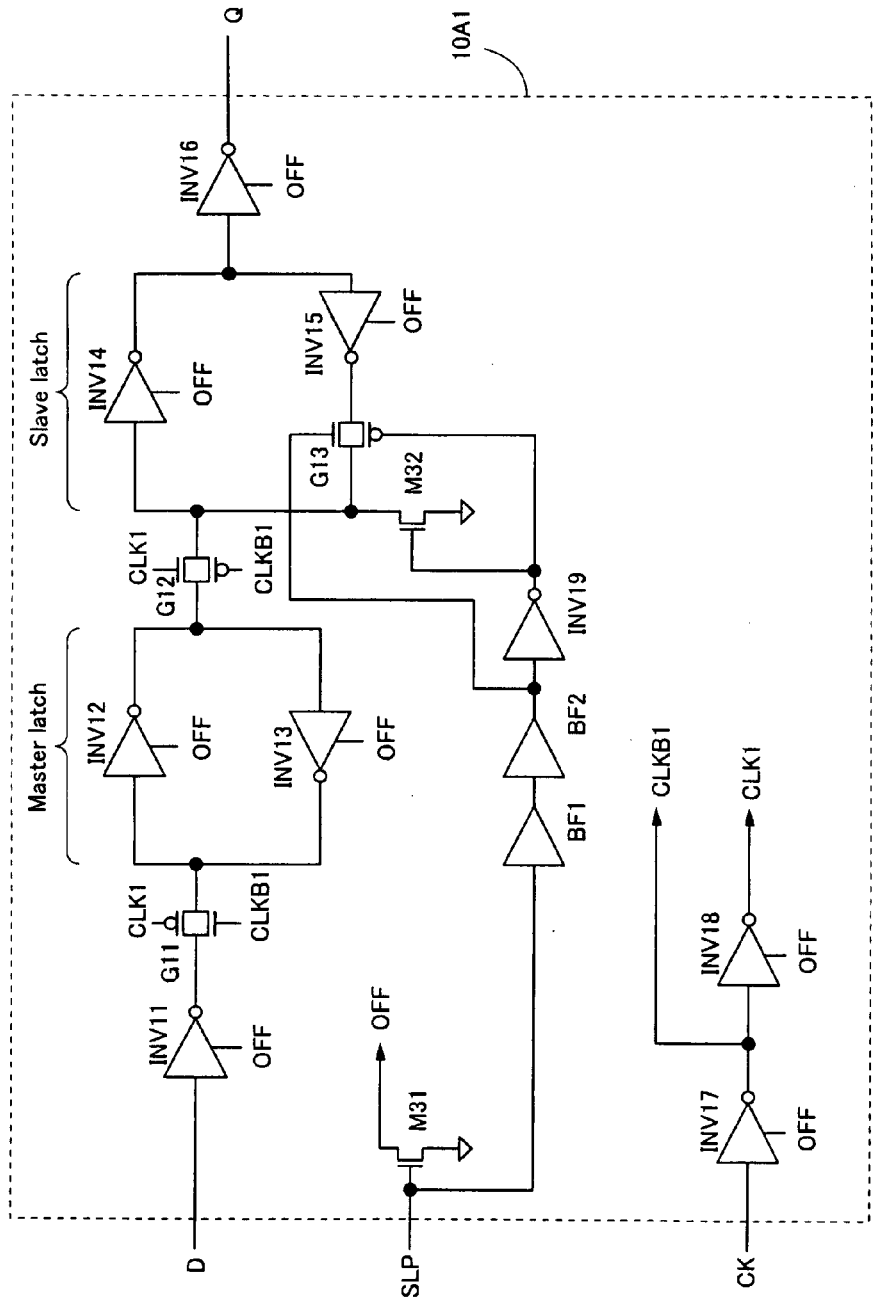
FIG. 3 is a circuit diagram of an exemplary non-retention flip-flop that constitutes a part of an exemplary semiconductor integrated circuit according to this disclosure.

FIG. 3 is a circuit diagram showing internal circuitry of an exemplary non-retention flip-flop 10A1 that constitutes a part of an exemplary semiconductor integrated circuit according to this disclosure. The exemplary non-retention flip-flop 10A1 suppresses power consumption during the sleep mode by terminating to supply electric power to all inverters in the circuit other than those in initializing circuit. In FIG. 3, INV11 to INV19 represent inverters, G11, G12, and G13 represent transmission gates, BF1 and BF2 represent buffers, and M31 and M32 represent NMOS transistors.

Each of the inverters INV11 to INV18 may be constructed by, for example, connecting a PMOS transistor and an NMOS transistor in series between the VDD power supply and GND, and coupling the gates of the transistors together. Note however, that the source (OFF) of the NMOS transistor is connected to the GND through an NMOS transistor M31, which turns OFF when the sleep signal SLP is "L" level.

Inverters INV12 and INV13 constitute a master latch, and inverters INV14 and INV15 constitute a slave latch. Inverters INV17 and INV18 generate negative clock signal CLKB1 and positive clock signal CLK1 from clock signal CK, which is input from outside of the flip-flop.

Transistor M31 acts as a switch controlled by sleep signal SLP. That is, when sleep signal SLP is at an "H" level (which represents the active mode), M31 turns ON and supplies electric power to each of inverters INV11 to INV18 thereby make the inverters active. While, when sleep signal SLP is "L" level (which represents the sleep mode), M31 turns OFF and cuts the supply of electric power to each of inverters INV11 to INV18.

Buffers BF1 and BF2, inverter INV19, transmission gate G13, and a transistor M32 constitute an initializing circuit.

In the active mode, sleep signal SLP is "H" level. As a result, transistor M31 is ON and inverters INV11 to INV18 are active. Further, the input and the output of inverter INV19 are "H" and "L" levels, respectively. As a result, transmission gate G13 is ON, and transistor M32 is OFF.

Although internal constructions of inverters INV13 and INV15 are not shown in FIG. 3, these inverters may preferably be clocked inverters similar to inverters INV3 and INV5 shown in FIG. 2. That is, inverter INV13 may have the same construction as inverter INV3, and may be supplied with negative clock signal CLKB1 and positive clock signal CLK1, instead of CLKB2 and CLK2, respectively. Inverter INV15 may also have the same construction as inverter INV3, and may be supplied with positive clock signal CLK1 and negative clock signal CLKB1, instead of CLKB2 and CLK2, respectively. In the active mode, the operation of non-retention flip-flop 10A1 is the same as the operation of retention flip-flop 10B1. That is, non-retention flip-flop 10B1 captures the data input into D terminal in the master latch when clock signal CK becomes "L" level. The captured data is held in the master latch and transferred to the slave latch, and is output to Q terminal when clock signal CK becomes "H" level. When clock signal CK becomes "L" level again, the data is held in the slave latch and is output to Q terminal.

Next, in order to switch to the sleep mode, first, clock signal CK is fixed to "L" level. Thereafter, sleep signal SLP changes to "L" level. As a result, transistor M31 turns OFF causing the supply of electric power to inverters INV11 to INV18 cut-off, and the flip-flop moves into the sleep (or power-saving) mode. In the power-saving mode, however, supply of electric power to buffers BF1 and BF2, and inverter INV19 are maintained. Accordingly, after a delay time T of the buffers BF1 and BF2 from the change of sleep signal SLP to "L" level, the input and the output of inverter INV19 become "L" and "H" levels, respectively. As a result, transistor M32 turns ON, and transmission gate G13 turns OFF.

Next, when sleep signal SLP changes into "H" level in order to return the non-retention flip-flop to the active mode, transistor M31 turns ON. As a result, the supply of electric power to inverters INV11 to INV18 are resumed and they become operative. Further, after the delay time T caused by buffers BF1 and BF2 from the change of sleep signal SLP to "H" level, the input and the output of inverter INV19 become "H" and "L" levels, respectively. Accordingly, transistor M32 becomes OFF and transmission gate G13 turns ON.

As a result, after the change of sleep signal SLP from "L" level to "H" level in order to return to the active mode, an "L" level pulse is generated at the drain of transistor M32 for the period of T. The pulse is input into inverter INV14 and, after the delay time T, is held in the slave latch constituted by inverters INV14 and INV15. That is, non-retention flip-flop 10A1 is initialized by the "L" level pulse such that output Q thereof becomes "L" level.

When it is necessary to initialize the non-retention flip-flop such that output Q becomes "H" level, the initializing circuit shown in FIG. 3 may be modified. For example, NMOS transistor M32 may be replaced with a PMOS transistor, with its gate connected to the input of inverter INV19, connected between the VDD power supply and the input of inverter INV14. Two types of non-retention flip-flops, which are capable to be initialized to different levels, may be used in different portions of an exemplary semiconductor integrated circuit.

D. Combination Logic Circuit

Exemplary combinational logic circuits that constitute parts of semiconductor integrated circuits according to this disclosure are not shown in drawings. However, an NMOS transistor controlled by sleep signal SLP, similar to the NMOS transistor M17 shown in FIG. 2, may be provided and its drain may be connected to source of each of NMOS transistors at the ground-side of various logic elements (logic gates) that constitute the combinational logic circuit. Thereby, similar to the inverters INV1, INV2, INV6, and INV7 shown in FIG. 2, supply of electric power to various logic elements in combinational logic circuits may be turned ON or turned OFF by changing the level of sleep signal SLP.

E. Non-Retention Flip-Flop

Second Example

Figure 4:
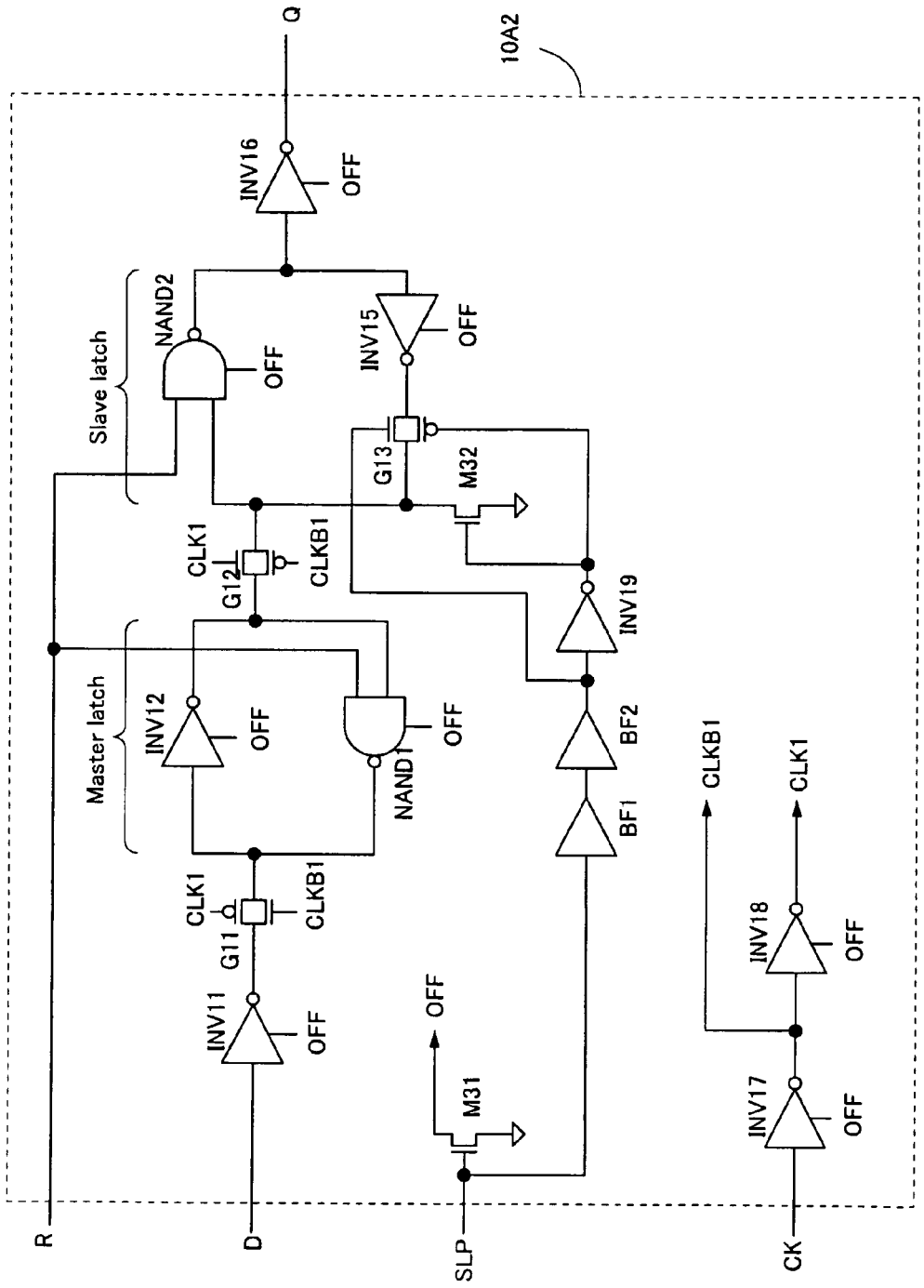
FIG. 4 is a circuit diagram of another exemplary non-retention flip-flop that constitutes a part of an exemplary semiconductor integrated circuit according to this disclosure.

FIG. 4 is a circuit diagram showing an internal circuitry of another exemplary non-retention flip-flop 10A2 that constitutes a part of an exemplary semiconductor integrated circuit according to this disclosure. The exemplary non-retention flip-flop 10A2 may be reset by a system reset signal R. Different from the exemplary non-retention flip-flop 10A1 shown in FIG. 3, inverters INV13 and INV14 in FIG. 3 are replaced with NAND circuits (NAND gates) NAND1 and NAND2, respectively. Transistor M31 controls supply of electric power to NAND circuits NAND1 and NAND2. Further, NAND gates NAND1 and NAND2 are turned-ON or OFF by system reset signal R.

In the exemplary non-retention flip-flop 10A2, system reset signal R is supplied to one of the input terminals of each of the NAND circuits NAND1 and NAND2. Accordingly, by temporarily setting system reset signal R to "L" level, NAND circuits NAND1 and NAND2 output "H" level pulses, and reset the master latch and the slave latch, respectively. Similar to inverter INV13 in the exemplary non-retention flip-flop 10A1 shown in FIG. 3, NAND gate NAND1 may preferably be a clocked gate that turns OFF when clock signal CK becomes "L" level.

Further, similar to non-retention flip-flop 10A1, when sleep signal SLP changes from "L" level to "H" level, an "L" level pulse is generated for a period of the delay time T at the drain of transistor M32. This "L" level pulse initializes the output Q of non-retention flip-flop 10A2 to "L" level.

When non-retention flip-flop equipped with system-reset capability such as an exemplary non-retention flip-flop shown in FIG. 4 is utilized, retention flip-flop may also be modified to be equipped with system reset capability. The exemplary retention flip-flop 10B1 shown in FIG. 2 may be modified to be equipped with system reset capability by replacing inverters INV3 and INV4 with NAND gates, as in the case of an exemplary non-retention flip-flop shown in FIG. 4. When it is required to initialize all flip-flops when, for example, starting to supply electric power to the semiconductor integrated circuit, system reset signal R may be utilized. While, when switching from the sleep mode to the active mode, the initialization function of non-retention flip-flop 10A2 may be utilized to initialize the non-retention flip-flop 10A2 without using the system reset. Thereby, non-retention flip-flops may be initialized without initializing retention flip-flops.

F. Non-Retention Flip-Flop

Third Example

Figure 5:
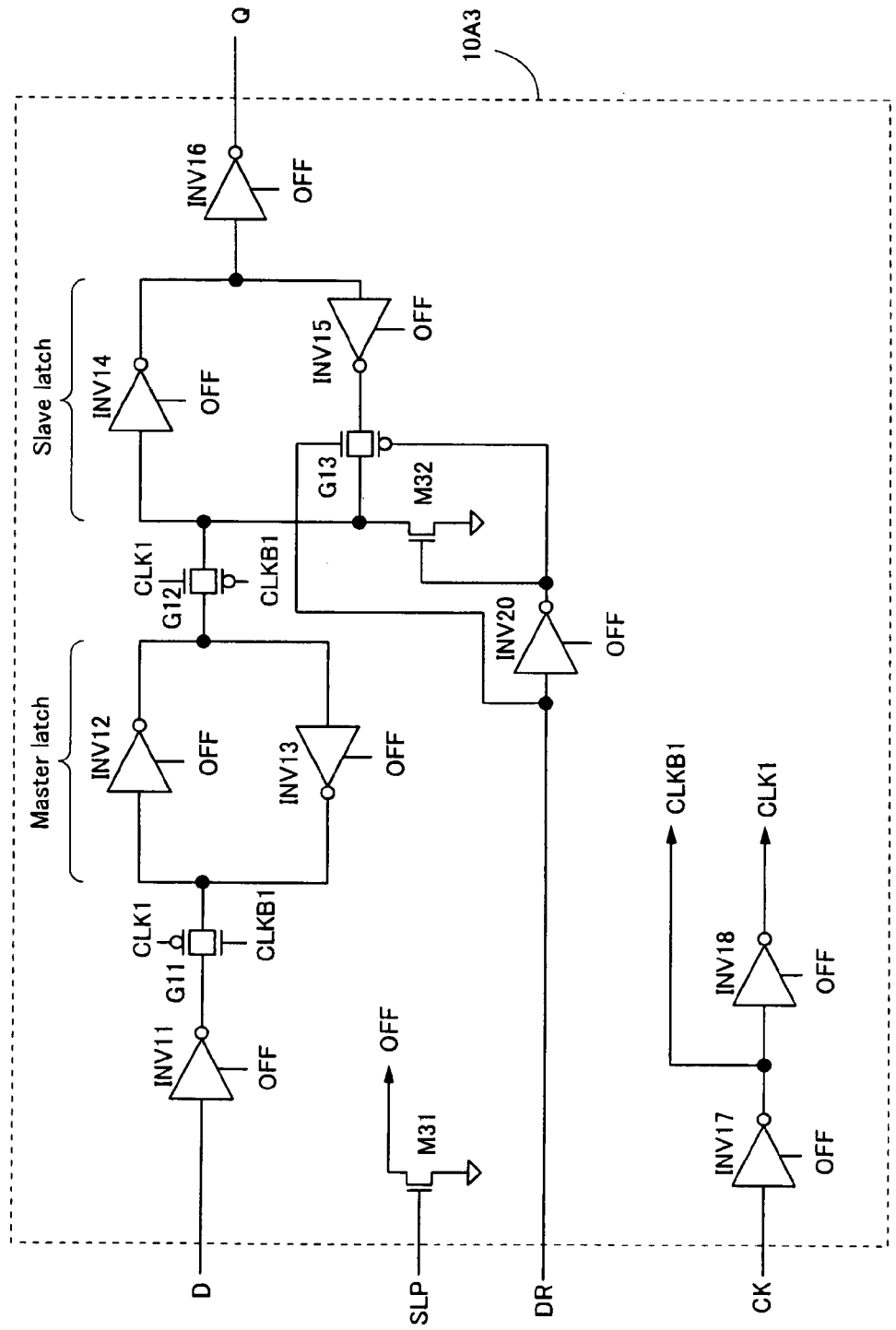
FIG. 5 is a circuit diagram of another exemplary non-retention flip-flop that constitutes a part of an exemplary semiconductor integrated circuit according to this disclosure.

FIG. 5 is a circuit diagram showing an internal circuitry of another exemplary non-retention flip-flop 10A3 that constitutes a part of an exemplary semiconductor integrated circuit according to this disclosure. The exemplary non-retention flip-flop 10A3 is similar to the exemplary non-retention flip-flop 10A1 shown in FIG. 3, except that buffers BF1 and BF2, and inverter INV19 in the initializing circuit is replaced with an inverter INV20. Inverter INV20 has a construction that an NMOS transistor M31, which turns OFF when the sleep signal SLP is "L" level, is connected between source (OFF) of the NMOS transistor thereof and the GND. Further, data retention signal DR is supplied to the inverter INV20.

As explained above, in order to switch the retention flip-flop 10B1 from the sleep mode to the active mode, sleep signal SLP changes from "L" level to "H" level and, then, data retention signal DR changes from "L" level to "H" level. When sleep signal SPL changes to "H" level, inverter INV20 in the initializing circuit become active. At this moment, data retention signal DR is still in "L" level, and inverter INV20 outputs "H" level signal. Then, when data retention signal DR changes to "H" level, the output of inverter INV20 becomes "L" level.

As a result, the initializing circuit, which is constituted by inverter INV20, transmission gate G13, and NMOS transistor M32, generates an "L" level pulse at the drain of transistor M32 for a period from the change of sleep signal SLP to "H" level to the change of data retention signal DR to "H" level. This "L" level pulse initializes the output Q of non-retention flip-flop 10A3 to "L" level. That is, the initializing circuit shown in FIG. 5 initializes the non-retention flip-flop 10A3 during a period determined by the change of the level of sleep signal SLP and the change of the level of data retention signal DR.

Different from the initializing circuit of the exemplary non-retention flip-flop 10A1 shown in FIG. 3, the initializing circuit shown in FIG. 5 does not directly receive sleep signal SLP. Nonetheless, the initializing circuit shown in FIG. 5 generates the "L" level initialization pulse when sleep signal SLP changes to "H" level. That is, although the initializing circuit shown in FIG. 5 does not receive sleep signal SLP, the initializing circuit indirectly detects the change of the level of sleep signal SLP and starts initializing the exemplary non-retention flip-flop 10A3. Alternately, it is possible to consider that NMOS transistor M31 is a part of the initializing circuit. In this case, the initializing circuit receives and detects the change of the level of sleep signal SLP, and starts initializing the exemplary non-data retention flip-flop 10A3.

The initialization circuit shown in FIG. 5 further detects the change of data retention flip-flop DR from "L" level to "H" level, and determines the timing to stop generating the "L" level initializing pulse. In other words, the initializing circuit shown in FIG. 5 detects the change of data retention signal DR to "H" level, and stops initializing the non non-retention flip-flop 10A3.

As explained above retention flip-flop 10B1 shown in FIG. 2 requires data retention signal DR to change from "L" level to "H" level after the change of sleep signal SLP from "L" level to "H" level in order to switch from the sleep mode to the active mode. Various other types of retention flip-flops may require the change of signals corresponding to the data retention signal DR in order to switch from the sleep mode to the active mode, although directions of the change may be different in different types of retention flip-flops. The exemplary non-retention flip-flop 10A3 may be used in combination with various types of retention flip-flops that require the change of the data retention signal or corresponding signals after the change of the sleep signal. If necessary, the initializing circuit may be modified to detect the change of the corresponding signal in a different direction.

The supply of electric power to inverter INV20, which constitute the initializing circuit shown in FIG. 5, is terminated during the sleep mode. As a result, compared with the exemplary non-retention flip-flop 10A1 shown in FIG. 3, the exemplary non-retention flip-flop 10A3 consume less electric power during the sleep mode. On the other hand, the exemplary non-retention flip-flop 10A1 shown in FIG. 3 does not need data retention signal DR. Thus, it is not necessary to provide a signal line to supply data retention signal DR to the non-retention flip-flop shown in FIG. 3.

Each of the initializing circuits used in exemplary non-retention flip-flops shown in FIGS. 3 and 5 may be constructed with MOS transistors alone. For example, a capacitor, which consumes a large area, is not required.

G. Comparative Example

Figure 6:
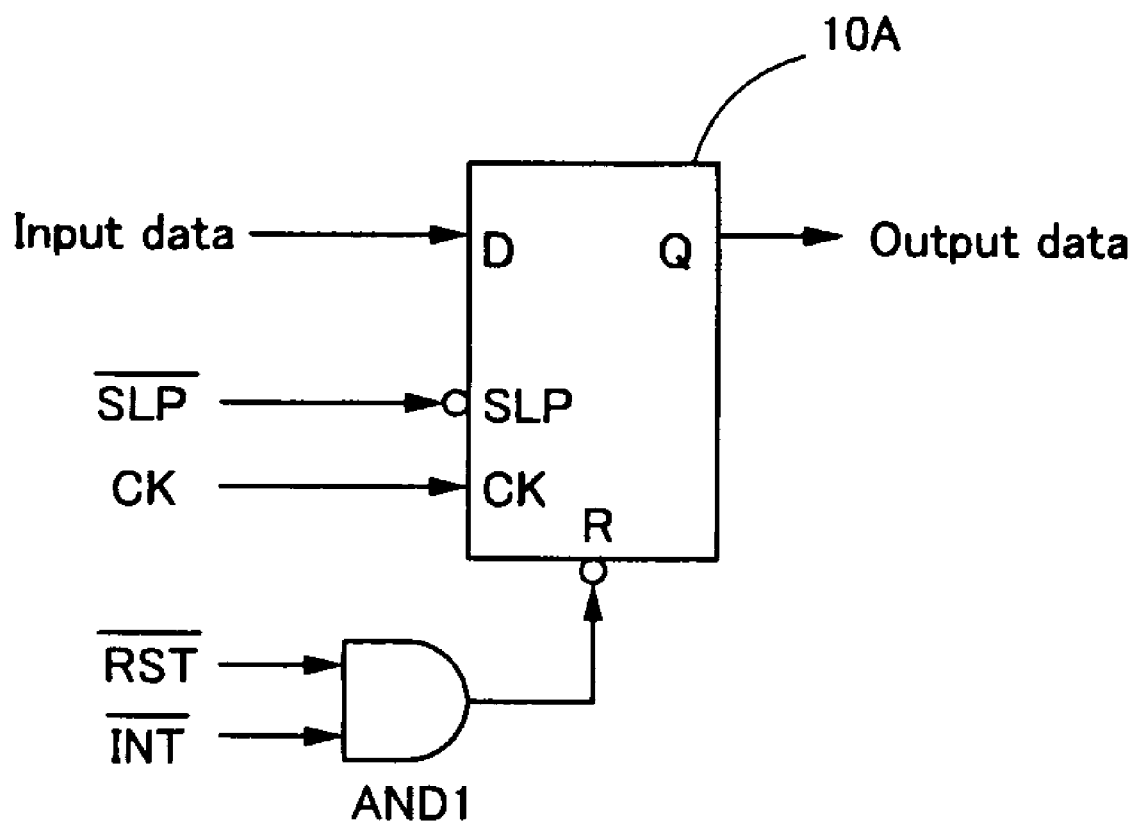
FIG. 6 is a circuit diagram of a conventional non-retention flip-flop having an initialization capability.

FIG. 6 is a circuit diagram showing a portion of conventional semiconductor integrated circuit. Specifically, FIG. 6 shows a conventional non-retention flip-flop 10A, which do not have an initializing circuit but has a system reset capability, used in a semiconductor integrated circuit such as shown in FIG. 1. To initialize the non-retention flip-flop 10A, an AND circuit AND 1 connected to system reset terminal R is added. In order to initialize the non-retention flip-flop 10A, a low level initialization signal INT is supplied to AND circuit AND1 separately from system reset signal RST.

Thus, it is necessary to add AND circuits to conventional non-retention flip-flops and additionally route a special line to supply initialization signal INT. It is further necessary to add a circuit that detects the switching of the semiconductor integrated circuit from the sleep mode to the active mode and generates initialization signal INT.

Contrary to the comparative example shown in FIG. 6, exemplary non-retention flip-flops such as shown in FIGS. 3, 4 and 5 have initializing circuits and are initialized when returning from the sleep mode to the active mode. Thus, in exemplary semiconductor integrated circuits according to this disclosure, it is not necessary to provide a circuit to generate initialization signal or to provide a special line to supply the initialization signal. Specifically, exemplary non-retention flip-flops shown in FIGS. 3, 4 and 5 have initializing circuits that detect change of the level of sleep signal SLP and perform initialization. Thus, switching from the sleep mode to the active mode may be detected reliably. Further, switching from the sleep mode to the active mode may be detected separately from starting to supply electric power to the semiconductor integrated circuit.

What is claimed is:

1. A semiconductor integrated circuit having an active mode and a sleep mode, the semiconductor integrated circuit comprising:
   a plurality of combinational logic circuits and a plurality of flip-flops that are connected alternately with each other, electric power being supplied to the combinational logic circuits and the flip-flops during the active mode so that the flip-flops hold data output from the combinational logic circuits;
   the plurality of flip-flops comprising:
   a retention flip-flop, the supply of the electric power to the retention flip-flop being maintained during the sleep mode so that the retention flip-flop retains the data during the sleep mode; and a non-retention flip-flop, the non-retention flip-flop including a switch through which the electric power is supplied to the non-retention flip-flop and an initializing circuit, wherein:

the switch includes a control terminal that receives a control signal, the control signal changes from a first level to a second level so that the switch turns from an OFF state to an ON state when the semiconductor integrated circuit switches from the sleep mode to the active mode; and the initializing circuit detects the change of the level of the control signal from the first level to the second level and initializes the non-retention flip-flop.

2. The semiconductor integrated circuit according to claim 1, wherein the initializing circuit initializes the non-retention flip-flop during a predetermined period after the initializing circuit detects the change of the level of the control signal.

3. The semiconductor integrated circuit according to claim 1, wherein each of the retention flip-flop and the non-retention flip-flop further includes a system reset terminal, each of the retention flip-flop and the non-retention flip-flop is initialized when a system reset signal is input to the system reset terminals.

4. The semiconductor integrated circuit according to claim 1, wherein:

the retention flip-flop includes a first terminal to receive the control signal and a second terminal to receive a retention signal, the retention signal changes from a third level to a fourth level after the change of the control signal from the first level to the second level when the semiconductor integrated circuit switches from the sleep mode to the active mode; and the initializing circuit detects the change of the level of the control signal from the first level to the second level to start initializing the non-retention flip-flop and further detects the change of the level of the retention signal from the third level to the fourth level to stop initializing the non-retention flip-flop.

5. A semiconductor integrated circuit having an active mode and a sleep mode, the semiconductor integrated circuit comprising:

a plurality of combinational logic circuits and a plurality of flip-flops that are connected alternately with each other, electric power being supplied to the combinational logic circuits and the flip-flops during the active mode so that the flip-flops hold data output from the combinational logic circuits;

the plurality of flip-flops comprising:

a retention flip-flop, the supply of the electric power to the retention flip-flop being maintained during the sleep mode so that the retention flip-flop retains the data during the sleep mode; and a non-retention flip-flop, the supply of the electric power to the non-retention flip-flop being terminated during the sleep mode, the non-retention flip-flop including an initializing circuit that initializes the non-retention flip-flop when the semiconductor integrated circuit switches from the sleep mode to the active mode.

6. The semiconductor integrated circuit according to claim 5, wherein the initializing circuit detects the switching of the semiconductor integrated circuit from the sleep mode to the active mode and initializes the non-retention flip-flop.

7. The semiconductor integrated circuit according to claim 5, wherein:

the non-retention flip-flop includes a switch through which the electric power is supplied to the non-retention flip-flop, the switch having a control terminal that receives a control signal, the control signal changes from a first level to a second level so that the switch turns from an OFF state to an ON state when the semiconductor integrated circuit switches from the sleep mode to the active mode; and the initializing circuit detects the change of the level of the control signal from the first level to the second level and initializes the non-retention flip-flop.

8. The semiconductor integrated circuit according to claim 7, wherein the initializing circuit initializes the non-retention flip-flop during a predetermined period after the initializing circuit detects the change of the level of the control signal.

9. The semiconductor integrated circuit according to claim 5, wherein each of the retention flip-flop and the non-retention flip-flop further includes a system reset terminal, each of the retention flip-flop and the non-retention flip-flop is initialized when a system reset signal is input to the system reset terminals.

10. A non-retention flip-flop for use in a semiconductor integrated circuit having an active mode and a sleep mode, the non-retention flip-flop comprising:

an input terminal that receives an input data;

latch circuitry that holds the input data;

an output terminal that outputs the data held in the latch circuitry;

a switch through which electric power is supplied to the latch circuitry, the switch having a control terminal that receives a control signal, the control signal changes from a first level to a second level so that the switch turns from an OFF state to an ON state when the semiconductor integrated circuit switches from the sleep mode to the active mode; and an initializing circuit, wherein the initializing circuit detects the change of the level of the control signal from the first level to the second level and initializes the latch circuitry.

11. The non-retention flip-flop according to claim 10, wherein the initializing circuit initializes the latch circuitry during a predetermined period after the initializing circuit detects the change of the level of the control signal.

12. The non-retention flip-flop according to claim 10, wherein:

the latch circuitry includes a master latch and a slave latch, the master latch holds the input data and outputs the data held therein to the slave latch, the slave latch holds the data output from the master latch and outputs the data held therein to the output terminal; and the initializing circuit initializes the slave latch without initializing the master latch.

13. The non-retention flip-flop according to claim 12, further comprising a system reset terminal, the master latch and the slave latch are initialized when a system reset signal is input to the system reset terminal.

14. The non-retention flip-flop according to claim 10, wherein:

the initializing circuit includes a retention signal terminal that receives a retention signal, the retention signal changes from a third level to a fourth level after the change of the level of the control signal from the first level to the second level when the semiconductor integrated circuit switches from the sleep mode to the active mode; and the initializing circuit detects the change of the level of the control signal from the first level to the second level to start initializing the non-retention flip-flop and further detects the change of the level of the retention signal from the third level to the fourth level to stop initializing the non-retention flip-flop.

15. A method of processing data in a semiconductor integrated circuit having an active mode and a sleep mode, the semiconductor integrated circuit comprising a plurality of combinational logic circuits and a plurality of flip-flops that are connected alternately with each other, the flip-flops including at least a retention flip-flop and at least a non-retention flip-flop, the method comprising:

supplying electric power to the combinational logic circuits and to the flip-flops during the active mode so that the flip-flops hold data output from the combinational logic circuits;

maintaining the supply of the electric power to the retention flip-flop during the sleep mode so that the retention flip-flop retains the data during the sleep mode and outputs the data retained therein when the semiconductor integrated circuit returns to the active mode; and terminating the supply of the electric power to the non-retention flip-flop during the sleep mode and initializing the non-retention flip-flop when the semiconductor integrated circuit returns to the active mode so that the non-retention flip-flop outputs initialized data when the semiconductor integrated circuit returns to the active mode, wherein the initializing comprises:

providing a switch through which the electric power is supplied to the non-retention flip-flop, the switch having a control terminal that receives a control signal, the control signal changes from a first level to a second level so that the switch turns from an OFF state to an ON state when the semiconductor integrated circuit switches from the sleep mode to the active mode; and further providing an initializing circuit in the non-retention flip-flop, wherein the initializing circuit detects the change of the level of the control signal from the first level to the second level and initializes the non-retention flip-flop.

16. The method according to claim 15, wherein the initializing includes initializing the non-retention flip-flop during a predetermined period after the initializing circuit detects the change of the level of the control signal.

17. The method according to claim 15, further comprising:
providing a system reset terminal in each of the retention flip-flop and the non-retention flip-flop; and
initializing the retention flip-flop and the non-retention flip-flop by supplying a system reset signal to each of the system reset terminals of the retention flip-flop and the non-retention flip-flop.

18. The method according to claim 15, further comprising:
supplying the control signal and a retention signal to the retention flip-flop, the retention signal changes from a third level to a fourth level after the change of the level of the control signal from the first level to the second level when the semiconductor integrated circuit switches from the sleep mode to the active mode,
wherein the initializing circuit detects the change of the level of the control signal from the first level to the second level to start initializing the non-retention flip-flop and further detects the change of the level of the retention signal from the third level to the fourth level to stop initializing the non-retention flip-flop.

19. A method of initializing a non-retention flip-flop in a semiconductor integrated circuit having an active mode and a sleep mode, the non-retention flip-flop comprising an input terminal that receives input data, a latch circuitry that holds the input data, and an output terminal that outputs the data held in the latch circuitry, the method comprising:

providing a switch through which electric power is supplied to the latch circuitry, the switch having a control terminal that receives a control signal, the control signal changes from a first level to a second level so that the switch turns from an OFF state to an ON state when the semiconductor integrated circuit switches from the sleep mode to the active mode; and further proving an initializing circuit in the non-retention flip-flop, wherein the initializing circuit detects the change of the level of the control signal from the first level to the second level and initializes the latch circuitry.

20. The method according to claim 19, wherein the initializing circuit initializes the latch circuitry during a predetermined period after the initializing circuit detects the change of the level of the control signal.

21. The method according to claim 19, wherein:
the latch circuitry includes a master latch and a slave latch, the master latch holds the input data and outputs the data held therein to the slave latch, the slave latch holds the data output from the master latch and outputs the data held therein to the output terminal; and
the initializing circuit initializes the slave latch without initializing the master latch.

22. The method according to claim 21, further comprising providing a system reset terminal in the non-retention flip-flop, and initializing the master latch and the slave latch by supplying a system reset signal to the system reset terminal.

23. The method according to claim 19, wherein:
the initializing circuit includes a retention signal terminal that receives a retention signal, the retention signal changes from a third level to a fourth level after the change of the level of the control signal from the first level to the second level when the semiconductor integrated circuit switches from the sleep mode to the active mode; and
the initializing circuit detects the change of the level of the control signal from the first level to the second level to start initializing the non-retention flip-flop and further detects the change of the level of the retention signal from the third level to the fourth level to stop initializing the non-retention flip-flop.

* * * * *